(12) United States Patent
Street et al.

(10) Patent No.: US 10,197,831 B1
(45) Date of Patent: Feb. 5, 2019

(54) BENDABLE TFT BACKPLANE WITH ADDRESSING CONTACTS AT OPPOSITE ENDS

(71) Applicant: Palo Alto Research Center Incorporated, Palo Alto, CA (US)

(72) Inventors: Robert A. Street, Palo Alto, CA (US); Julie A. Bert, East Palo Alto, CA (US); John C. Knights, Soquel, CA (US)

(73) Assignee: PALO ALTO RESEARCH CENTER INCORPORATED, Palo Alto, CA (US)

(*) Notice: Subject to any disclaimer, the term of this patent is extended or adjusted under 35 U.S.C. 154(b) by 0 days.

(21) Appl. No.: 15/845,058

(22) Filed: Dec. 18, 2017

(51) Int. Cl.
*H01L 29/10* (2006.01)
*G02F 1/1333* (2006.01)
*G02F 1/1362* (2006.01)
*G02F 1/1343* (2006.01)
*H01L 29/786* (2006.01)
*H01L 29/417* (2006.01)
*H01L 29/66* (2006.01)
*H01L 27/12* (2006.01)

(52) U.S. Cl.
CPC ...... *G02F 1/133305* (2013.01); *G02F 1/1362* (2013.01); *G02F 1/13439* (2013.01); *H01L 27/1214* (2013.01); *H01L 29/41733* (2013.01); *H01L 29/66765* (2013.01); *H01L 29/78603* (2013.01)

(58) Field of Classification Search
CPC ........... H01L 27/1214; H01L 29/66765; H01L 29/41733; H01L 29/78603; G02F 1/133305; G02F 1/13439; G02F 1/1362
See application file for complete search history.

(56) References Cited

U.S. PATENT DOCUMENTS

2008/0244228 A1* 10/2008 Overdick ............. H04N 3/1562
712/39

* cited by examiner

*Primary Examiner* — Stephen Bradley
*Assistant Examiner* — Wasiul Haider
(74) *Attorney, Agent, or Firm* — Fay Sharpe LLP (57) ABSTRACT

A flexible TFT backplane includes, a flexible substrate, a first set of address line contacts associated with the substrate, and a second set of address line contacts associated with the substrate. The first set of address line contacts and the second set of address line contacts are located at opposite sides of the substrate from each other, defining a vertical direction. A first set of address lines designed to run in one of the vertical direction and a diagonal or non-vertical direction with respect to the defined vertical direction, with the first set of address lines connected to the first set of address line contacts. Also provided is a second set of address lines designed to run in one of a diagonal or non-vertical direction with respect to the defined vertical direction, and a combination of diagonal and horizontal directions with respect to the vertical direction, with the second set of address lines connected to the second set of address line contacts. At least one insulating layer is located between the first set of address lines and the second set of address lines, and a plurality of TFTs arranged in an array, within the boundaries of the substrate, wherein the TFTs are addressed by the first set of address lines and the second set of address lines.

18 Claims, 11 Drawing Sheets

BENDABLE TFT BACKPLANE WITH ADDRESSING CONTACTS AT OPPOSITE ENDS

BACKGROUND

The present disclosure is directed to electronic backplanes and more particularly to backplanes which employ bendable flexible substrates.

Backplanes carry electronic components including but not limited to transistors (e.g., thin film transistors (TFTs), etc.) which are addressed via gate lines and data lines.

Traditionally, backplanes have been fabricated with glass substrates, resulting in rigid backplanes, which limits the areas where they may be employed. Therefore there is the present interest in manufacturing backplanes with bendable flexible (e.g., plastic, polymers, etc.) substrates in order to increase the overall bendability or flexibility of the backplane itself, which expands the areas where they may be used.

An issue concerning bendable flexible backplanes is however, the electronics used to address the electronic devices of the backplane (e.g., TFTs, etc.). Such electronics include chip-on-flex (COF) packages and/or printed circuit boards (PCBs). These electronics have much less bendability flexibility than the bendable flexible substrate. Therefore, when using common backplane architecture the benefit of the bendable flexible substrate is diminished. Particularly, in such architecture the sets of addressing lines (e.g., data addressing lines and gate addressing lines) run substantially in horizontal and vertical manners crossing each other (though in different metal layers and isolated from each other) at substantially 90 degrees. This arrangement causes the associated addressing electronics (e.g. the chip on flex (COF) packages, PCBs, etc.) to be positioned on adjacent sides of the backplane which acts to restrict the overall flexibility bendability of the backplane.

The present disclosure is directed to the design and manufacture of backplanes which overcome the existing limitations in order to increase bendability and flexibility.

BRIEF DESCRIPTION

A flexible TFT backplane includes, a flexible substrate, a first set of address line contacts associated with the substrate, and a second set of address line contacts associated with the substrate. The first set of address line contacts and the second set of address line contacts are located at opposite sides of the substrate from each other, defining a vertical direction. A first set of address lines designed to run in one of the vertical direction and a diagonal or non-vertical direction with respect to the defined vertical direction, with the first set of address lines connected to the first set of address line contacts. Also provided is a second set of address lines designed to run in one of a diagonal or non-vertical direction with respect to the defined vertical direction, and a combination of diagonal and horizontal directions with respect to the vertical direction, with the second set of address lines connected to the second set of address line contacts. At least one insulating layer is located between the first set of address lines and the second set of address lines, and a plurality of TFTs arranged in an array, within the boundaries of the substrate, wherein the TFTs are addressed by the first set of address lines and the second set of address lines.

DETAILED DESCRIPTION

Backplanes which implement an array of electronic devices, such as TFTs, etc. are useful in a wide variety of products and systems. Providing a backplane with increased bendability flexibility further increases the usefulness of such backplanes. In embodiments described herein TFT-type backplanes are disclosed having gate and data addressing contacts (of addressing electronics, including but not limited to COFs and PCBs) positioned on opposite sides of the backplane (as opposed to adjacent to each other) and an arrangement of gate address lines and data address lines designed to address all of the TFT pixels of the array. The disclosed embodiments can be used in a variety of implementations such as for detectors, including x-ray detectors, LCD devices, OLED devices, and reflective displays, among numerous others. Therefore, while the present discussion may describe particular implementations, it should be understood that backplanes with the architectures described herein are not limited thereto.

For purposes of discussion, the following describes an implementation where a disclosed for use with detectors, such as digital x-ray detectors. These devices can commonly be fabricated on a glass using an amorphous silicon (a-Si) thin film transistor (TFT) backplane and an a-Si photodiode. Other materials can be used, such as but not limited to metal oxides, polycrystalline silicon, and organic semiconductors for the TFT and organic materials for the photodiode. An x-ray scintillator is placed in contact with the backplane to convert x-rays to light that is detected by the photodiode. The scintillator is typically either Tb-doped gadolinium oxysulphide (GOS) or CsI, but other materials are possible. The GOS may be adhesive bonded to the backplane or simply pushed into contact. The CsI may be deposited directly on the backplane or formed as a separate layer pushed into contact. An alternative approach is to use an x-ray photoconductor such as selenium with a very similar TFT backplane. The current disclosure applies to either type of structure, as well as others including manufacture of display devices using known manufacturing processes.

The same TFT and photodiode structures can be deposited on a plastic substrate instead of glass to form a bendable flexible. There are various known fabrication processes to make a photodiode array addressed by a TFT detector backplane on a flexible substrate. A common method that is used in current manufacturing is to form a thin polyimide (PI) layer on a conventional glass substrate. The TFT backplane is then manufactured with the same process as if it were on glass without the PI layer. After the processing is complete, the GOS scintillator is bonded to the front surface to give support to the thin PI film and the a-Si layers. The combination is then released from the glass substrate and a plastic layer is bonded to the back side for additional protection. The flexible nature of the plastic substrates and GOS scintillator make the array bendable.

Bendable detectors are of interest, for example to inspect pipelines or other curved objects, to image objects in confined spaces where a rigid flat detector could not be introduced, and to conform to the human body for added comfort and resolution.

Active matrix designs such as the described digital x-ray detectors, perform addressing by sequentially applying a voltage pulse to the gate lines of the TFTs (also called scan lines) while reading out the charge signal on the data lines.

Figure 1:
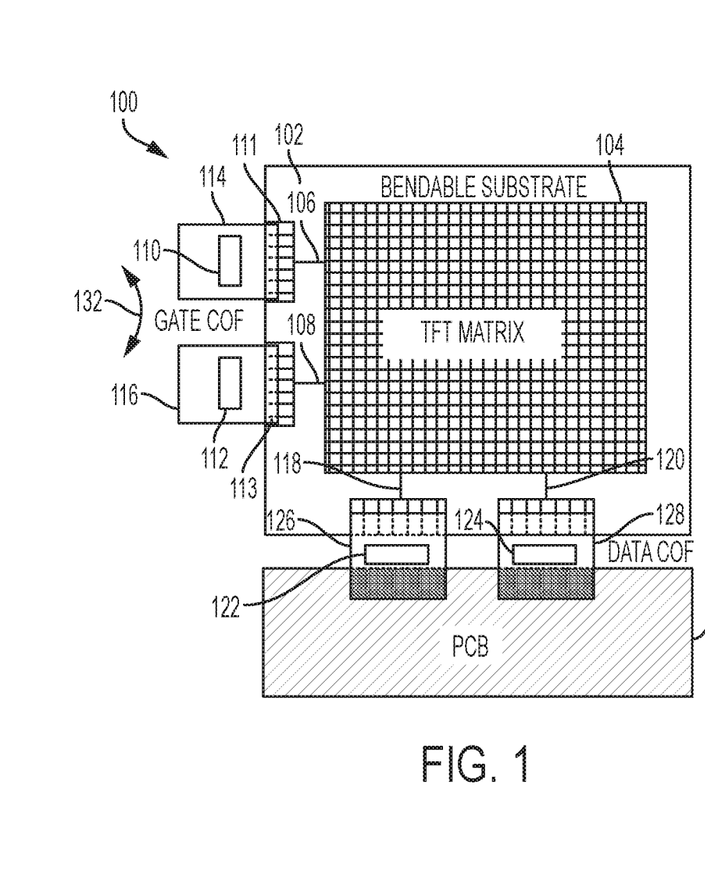
FIG. 1 illustrates a conventional structure of an active matrix detector TFT backplane with gate drivers and data readout on adjacent sides of the active matrix.

Turning to FIG. 1, illustrated is a bendable flexible backplane structure 100 which has a bendable flexible substrate 102, carrying a TFT matrix 104 (which includes a plurality of TFTs and associated gate lines and data lines formed in a conventional manner). Gate lines portions 106, 108 (shown as two single lines for convenience of viewing, as it understood there would be numerous additional ones of these gate line portions of the gate lines) extend from the TFT matrix 104, and contact shift register usually in the form of a silicon integrated circuit (the gate chips) 110, 112, via gate contacts 111, 113. Typically the gate chips 110, 112 are mounted on gate chip-on-flex (COF) package(s) 114, 116 which are bonded to the substrate 102. Similarly, data line portions 118, 120 (again two single lines for viewing convenience) are connected to data readout chips 122, 124 which are either in COF packages 126, 128 and/or mounted on a printed circuit board (PCB) 130—on the bendable flexible substrate 102. The data COFs 126, 128 are often connected directly to a PCB 130, but many of the available gate chips do not require a connection to a PCB.

As can be seen from FIG. 1, the gate packages 114, 116 and the data packages 126, 128 (as well as the PCB 130) are positioned on immediately adjacent sides of the bendable flexible substrate 102.

One-dimensional bending of the structure 100 is best done with curvature in the gate line direction (see 132 of FIG. 1) as this does not require bending of the PCB 130. However, the gate chips 110, 112 are rigid silicon so that although the COF packages 114, 116 allow some bending, it is also severely limited by the lack of bendability of the rigid gate chips 110, 112 embedded in the COFs 114, 116.

Figure 2:
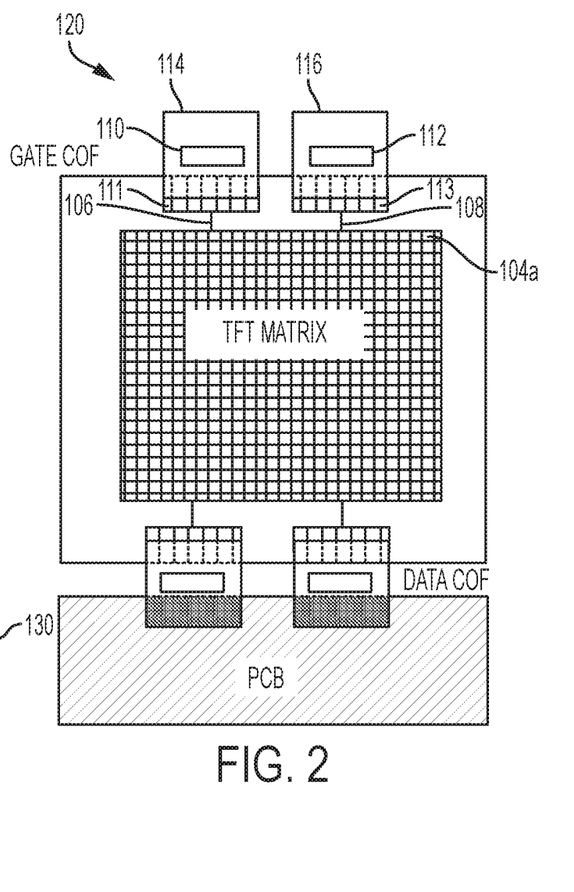
FIG. 2 illustrates a backplane structure in accordance with the present disclosure where gate driver devices are on a side of the backplane opposite a side from data readout devices, enabling increased continuous bending or flexing.

The proposed solution to the limited bendability flexibility of the structure 100 of FIG. 1, is to manufacture a backplane design with the gate electronics (e.g., gate drivers such as the gate COFs), and data electronics (e.g., data readout connections such as the data COFs) positioned on opposite sides of the backplane array as illustrated in structure 120 of FIG. 2, rather than at immediately adjacent sides as shown in FIG. 1. However, this configuration is not possible with the conventional arrangement of gate and data address lines (i.e., in horizontal versus vertical, causing a 90 degree crossing of the gate and data address lines). Therefore this disclosure describes architectures that are able to address the array of TFTs in a manner that increases bendability and flexibility. It is mentioned that for convenience the TFT matrix 104a of FIG. 2 may appears to depict addressing lines in a conventional manner, however it is understood the TFT matrix 104a is intended to include address line arrangements as disclosed herein which permit the placement of the gate electronics and data electronics as shown in FIG. 2.

Figure 3A:
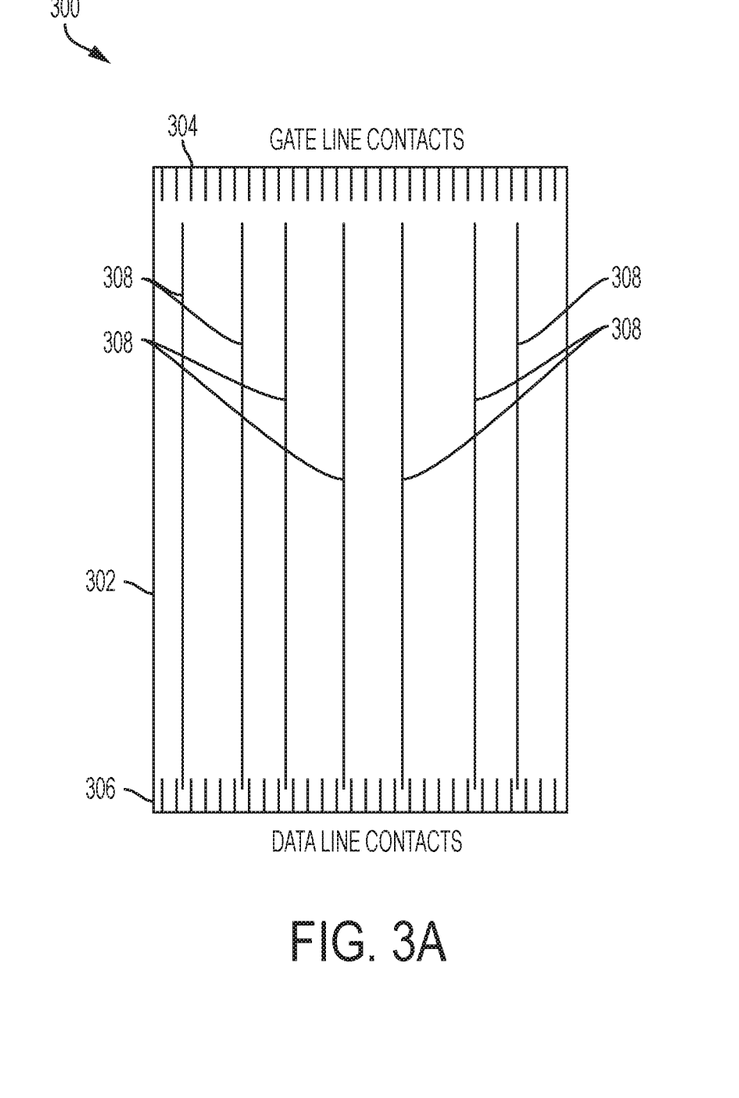
FIGS. 3A-3D illustrate an embodiment of the design and construction of gate and data address lines terminating on the opposite sides of a TFT backplane segment according to the present disclosure.
Figure 3B:
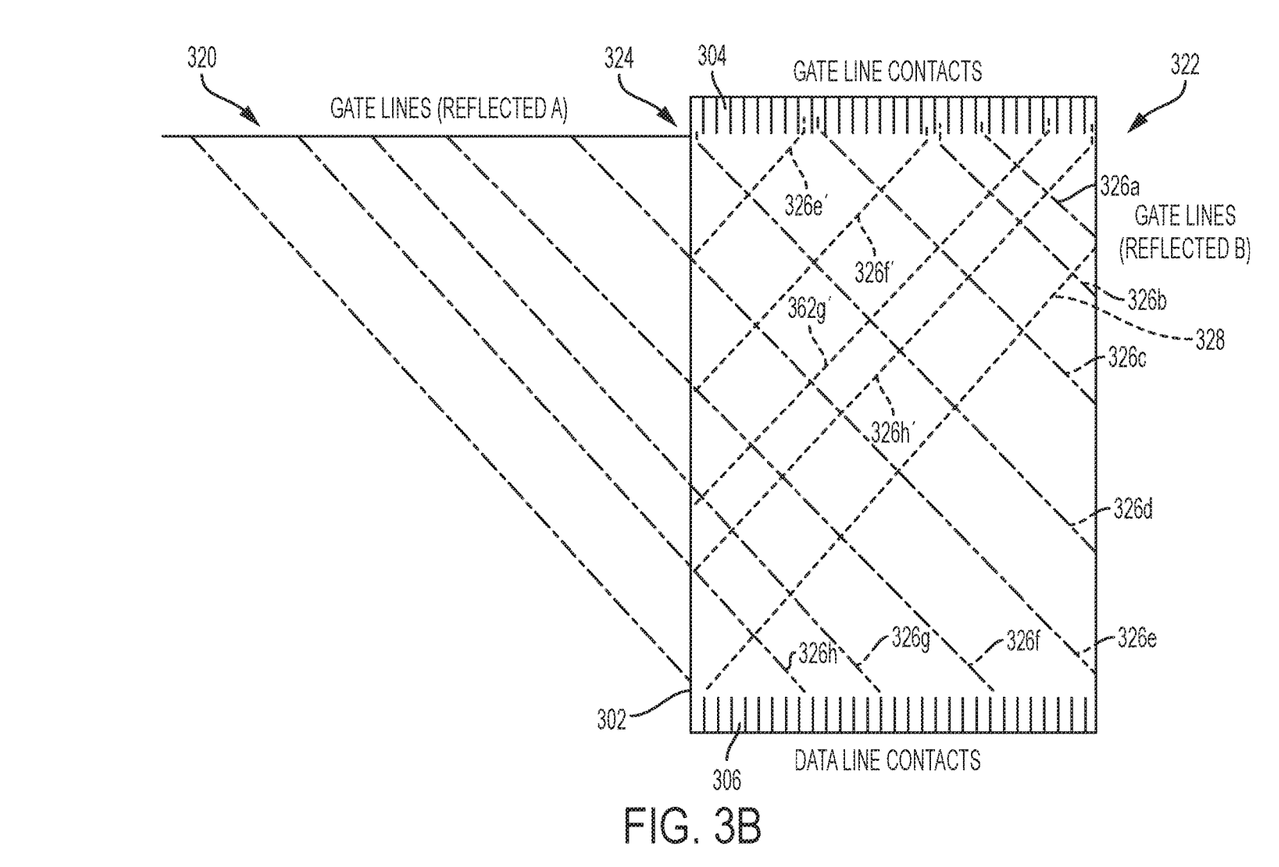
Figure 3C:
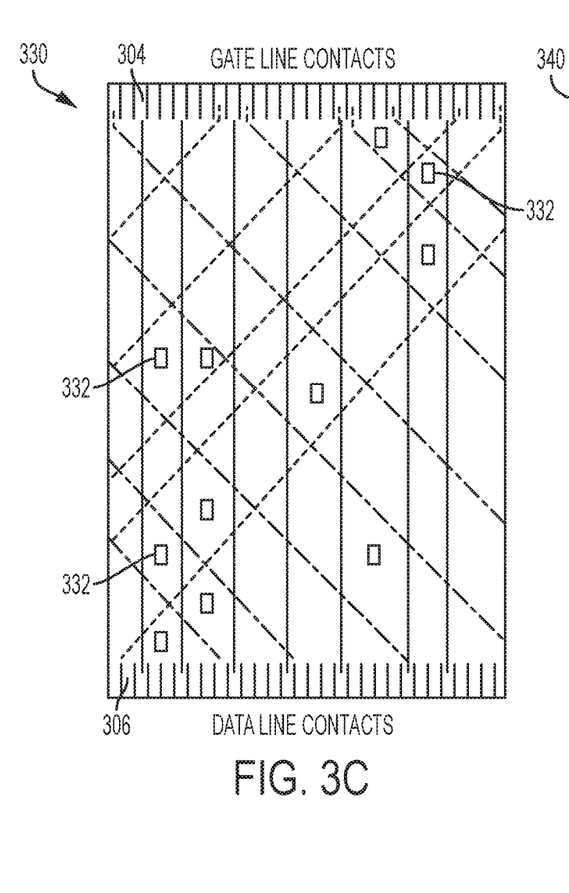
Figure 3D:
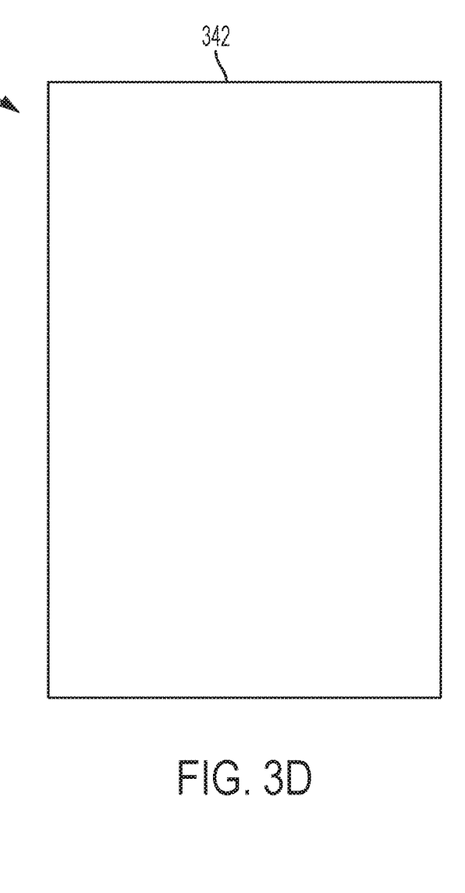

Turning to FIGS. 3A-3D depicted are stages of a backplane architecture which allows for the placement of gate line contacts and data line contacts on opposite sides of a bendable flexible substrate carrying a transistor (TFT) array. FIG. 3A depicts the layout for data lines; FIG. 3B depicts the layout for gate lines; FIG. 3C depicts a backplane with the layers combined; and FIG. 3D depicts an insulator layer, and represents the one or more insulator layers of the embodiment.

Placement of the gate line contacts and data line contacts on opposite sides of a bendable flexible substrate is achieved by employing unique design layout of the addressing lines (i.e., data lines and gate lines) on the bendable flexible backplane. It is to be appreciated FIGS. 3A-3D may be understood to represent a portion of a larger backplane arrangement, and that the previously discussed gate electronics and data electronics of FIG. 2 would be associated with the gate line contacts and the data line contacts.

Returning to configuration 300 of FIG. 3A, illustrated is bendable flexible substrate 302, associated gate line contacts 304, associated data line contacts 306, and vertical data lines 308. The data lines 308 are connected to the data line contacts 306 at the bottom side of the backplane array, as in a conventional layout. It is understood in manufacture, the data lines within the boundaries of the substrate 302 are provided in a layer of metal distinct from the substrate 302, as well as other components including but not limited to the associated gate line contacts 304 and data line contacts 306, of this and other embodiments herein. It is also understood lines 308 are vertical as in the defined vertical direction between the gate line contacts 304 and the data line contacts 306.

Turning now to FIG. 3B illustrated is a gate line layout 320 according to the present disclosure. Shown again for description purposes is substrate 302, as well as gate line contacts 304, and data line contacts 306, each associated with the substrate 302.

Initially, diagonal (also called non-vertical) gate lines 326a-326h (with respect to the defined vertical direction) are generated starting from an upper area 322 on the right side of the backplane array (i.e., an area which will include the TFT matrix array, within the boundaries of the substrate) and extending these gate lines to the left side 324 of the array in an upward moving fashion, towards and/or into the gate line contacts 304. It is noted some of the diagonal gate lines 326e-326h (for the purpose of obtaining the layout—but not in actual manufacture) extend past the edge of the substrate 302. As will be seen in FIG. 3C the gate and data lines cross at all points of the actual rectangular array, showing that this design is capable of providing matrix addressing of every pixel in the array.

The next step in the layout process is to reflect or fold the layout of the gate lines 326e-326h that protrude to the left side of the substrate of the backplane array, with respect to the left vertical side of the substrate of the backplane array. These are reflected or folded gate lines 326e'-326h'. This means that the gate lines 326e'-326h' are drawn as connected to and going diagonally down from the gate line contacts 304 to the left, and when the gate line reaches the edge of the array the gate line continues in a diagonal going down to the right (i.e., those portions of 326e-326h that are within the boundaries of the substrate of the backplane array. This design procedure ensures that all the pixels can be addressed by the disclosed addressing structure.

It can be seen that the un-reflected or un-folded gate lines 326a-326d address TFT pixels in the upper right corner of the array (i.e., from gate line 326d to the upper right hand corner of the backplane array. The reflected gate lines 326e'-326g' address the TFT pixels in that portion of the backplane array correlating to those gate lines. If the substrate or array is designed to be taller than it is wide, the reflected gate lines leading to the bottom left corner do not intersect the gate line contacts within the array contact area. Instead, gate line 328 is reflected or folded for the right side (marked reflected B), and this line addresses the TFT pixels in the bottom left.

It is understood in manufacture, the gate lines within the boundaries of the substrate 302 are provided in two separate layers of metal distinct from the substrate 302. In particular, wherever gate lines in the layout of FIG. 3B cross each other, in order to avoid a shorting situation, one of the crossing gate lines is manufactured in one metal layer and the other crossing gate line is manufactured in a second metal layer.

FIG. 3C illustrates the resulting layout of the data address lines of FIG. 3A and the gate address lines of FIG. 3B combined (i.e., the metal layer carrying the data lines, and the two metal layers each carrying portions of the gate lines which do not crossover other gate lines with in the same metal layer). Also depicted are a plurality of TFT/photodiode configurations 332, which in construction, are selectively connected to appropriately corresponding data lines and gate lines (connection lines there between not shown). It is understood such connection lines are not depicted for clarity of viewing, similarly only a sample of the TFT/photodiode configurations 332 are provided for illustration, and it is understood in manufacture further configurations 332 would be provided. Also, the configurations 332 are understood to further represent other arrangements such as, but not limited to, those that may be used in construction of display backplanes.

FIG. 3D illustrates an insulation layer 340 made of an insulating material 342, and is intended to represent the insulation required for the backplane construction according to the present embodiment. In this embodiment, there are two separate layers of insulation. More particularly there would be one insulation layer between the metal layer carrying the data lines, and one of the two metal layers carrying some of the gate address lines, and a second insulation layer between each of the two metal layers carrying portions of the separate gate address lines. Therefore it is understood that the appropriate number and placement of the insulating layers would be included in a backplane such as shown in FIG. 3C. Also, it is understood that in manufacture via openings would be made in this insulating layer to connect gate or data lines to the TFT/photodiodes, and such vias are not depicted for clarity of viewing.

Figure 4A:
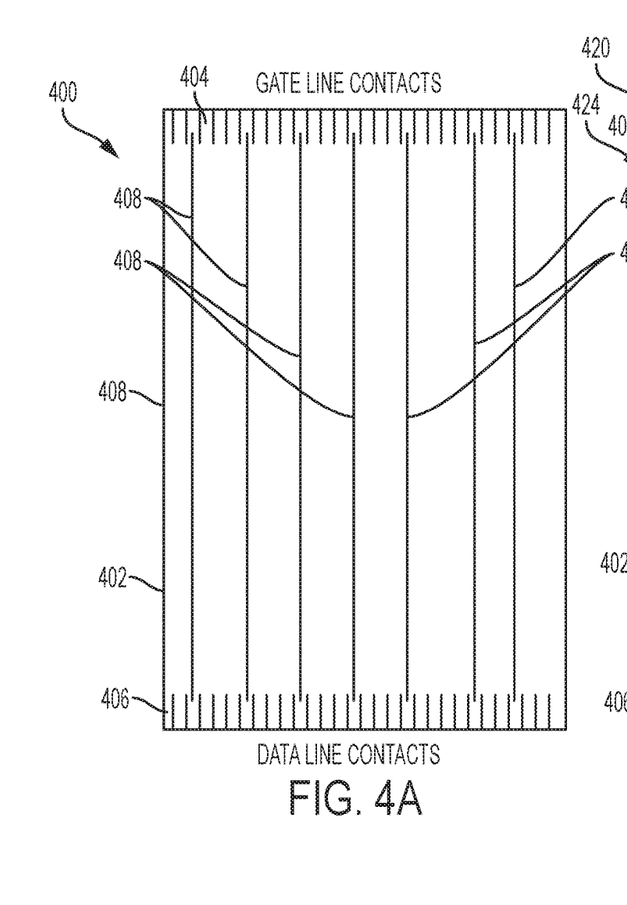
FIG. 4A-4D illustrate an alternative embodiment of the design and construction of a TFT backplane segment according to the present disclosure.
Figure 4B:
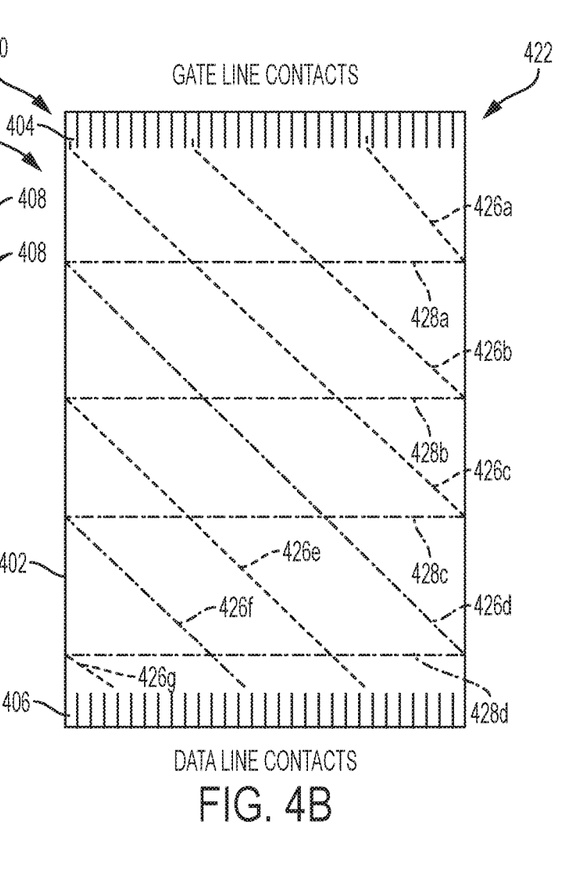
Figure 4C:
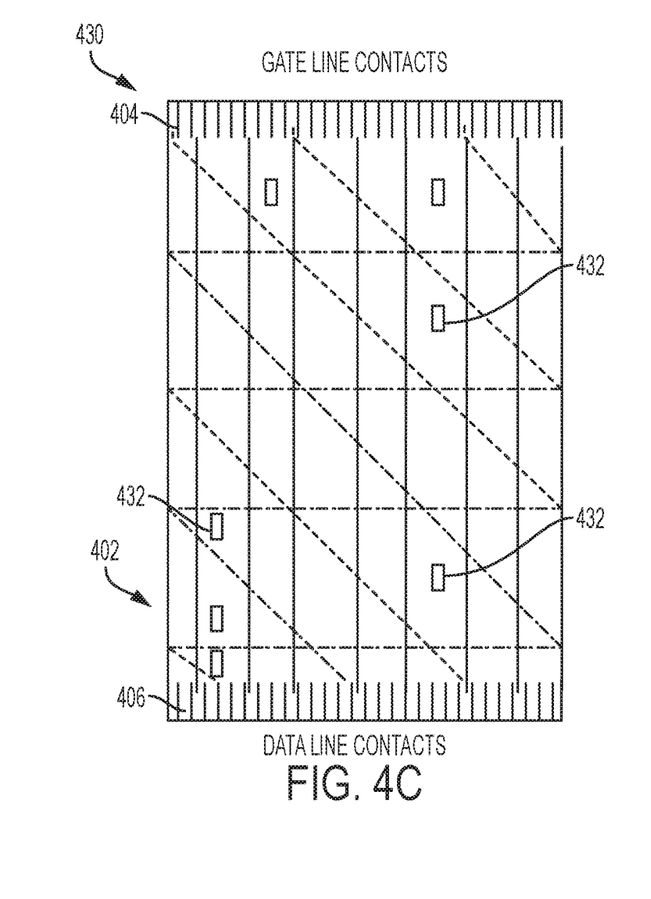
Figure 4D:
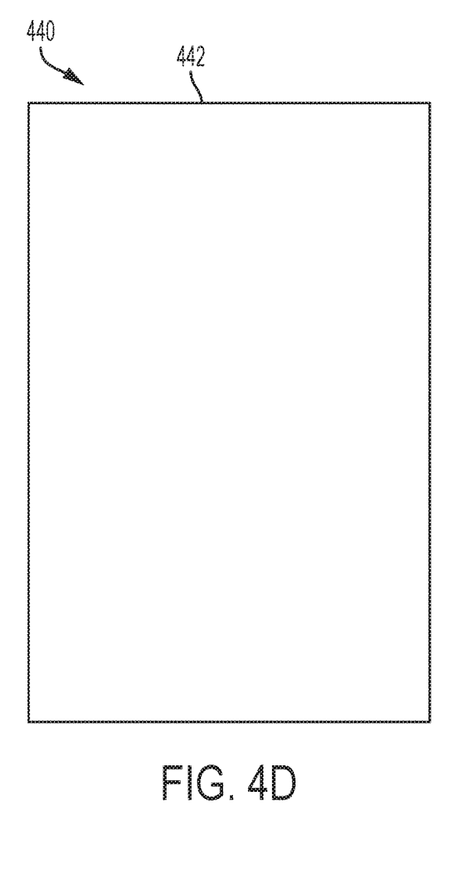

Turning now to FIGS. 4A-4D, illustrated is a modification of the foregoing design made by translating extra gate lines rather than reflecting or folding them. FIG. 4A depicts the layout for data lines; FIG. 4B depicts the layout for gate lines; FIG. 4C depicts a backplane 430 with the address layers combined (gate and data); and FIG. 4D depicts an insulator layer, and represents the one or more insulator layers of the embodiment.

Returning to the configuration 400 of FIG. 4A, illustrated is bendable flexible substrate 402, gate line contacts 404, data line contacts 406, and vertical data lines 408. The data lines 408 are connected to the data line contacts 406 at the bottom side of the backplane array, as in a conventional layout. It is understood in manufacture, the data lines within the boundaries of the substrate 402 are provided in a layer of metal distinct from the substrate 402.

Turning now to FIG. 4B illustrated is a description of the gate lines layout 420. Shown again for description purposes is substrate 402, gate line contacts 404, and data line contacts 406.

Initially, in this embodiment, diagonal (also called non-vertical) gate lines 426a-426g are generated starting from an upper area 422 on the right side of the array (e.g., a TFT array area within the boundaries of the substrate) and extending these gate lines 926a-926g to the left 424 of the array in an upward moving fashion (e.g., towards the top of the drawing page where the gate line contacts 404 are located). In this case there is provided (instead of the reflected or folded lines) connecting horizontal lines 428a-428d. FIG. 4C illustrates the described data lines layout and gate lines layout combined 430. Also depicted are a plurality of TFT/photodiode configurations 432, which in manufacture are selectively connected to appropriately corresponding data line and gate lines (connection lines there between not shown). It is understood such connection lines are not depicted for clarity of viewing, similarly only a sample of the TFT/photodiode configurations 432 are provided for illustration, and it is understood in manufacture operations further configurations 432 would be provided. Also, the configurations 432 are understood to further represent other arrangements such as, but not limited to, those that may be used in construction of display backplanes.

FIG. 4D illustrates an insulation layer 440 made of an insulating material 442, and is intended to represent the insulation required for the backplane construction according to the present embodiment. In this embodiment two separate layers of insulation. More particularly there would be one insulation layer between the metal layer carrying the data lines, and one of the two metal layers carrying some of the gate address lines, and a second insulation layer between each of the two metal layers carrying portions of the separate gate address lines. Therefore it is understood that the appropriate number and placement of the insulating layers would be included in a backplane such as shown in FIG. 4C. Also, it is understood that in manufacture via openings would be made in this insulating layer to connect gate or data lines to the TFT/photodiodes, and such vias are not depicted for clarity of viewing.

As discussed it has been noted the designs of FIG. 3A-3D or 4A-4D have gate lines that cross each other and also cross the data lines. The conventional TFT fabrication process has two metal layers that form the matrix addressing, however this is not enough to immediately allow the manufacture the configurations shown in FIGS. 3C and 4C due for example, to the crossing of the gate lines.

One solution as discussed is to add an additional, third, metal layer, which adds processing complexity. Another solution is to include a pair of vias in each pixel, as needed, to allow lines designed in the same metal layer to cross each other using the first and second metal layers. For example, two gate lines that need to cross each other could use a pair of vias to route through the data line layer. It is understood that the opposite could also be done and a data line crossing could be routed through the gate line layer. However, having many vias along an address line may be a problem because it can increase the line resistance and if a single via fails then there will be a defective line.

The intersection of the gate and data lines shown in FIGS. 3C and 4C is not a square (or a rectangle) as in the conventional TFT backplane geometry. However, the pixel, as defined by the photodiode can remain square or rectangular. The photodiode is fabricated in layers above the address lines and its edges do not have to follow the direction of the address lines. Alternatively the horizontally running address lines can be routed around the edges of the square photodiode and so will have a zig-zag shape to form the diagonal gate lines.

The design of FIGS. 3C and 4C has gate lines going diagonally in both directions from the gate contacts and the total number of gate lines is larger than the number of pixels in a vertical column of pixels. However, a pair of gate lines going in the two directions can be connected to the same gate contact. Where two gate lines cross at a pixel, the design selects one or other to address the pixel. Hence it is not necessary to have more gate contacts than in the normal configuration. However it may be a design choice to address the pair of gate lines separately.

FIGS. 5A-5D illustrate an addressing design that has both the gate and data lines drawn diagonally (also called non-vertical), structured in a similar manner as disclosed in FIG. 3B, to be able to address all the pixels, i.e., the use of reflecting or folding as discussed in connection with that figure.

Figure 5A:
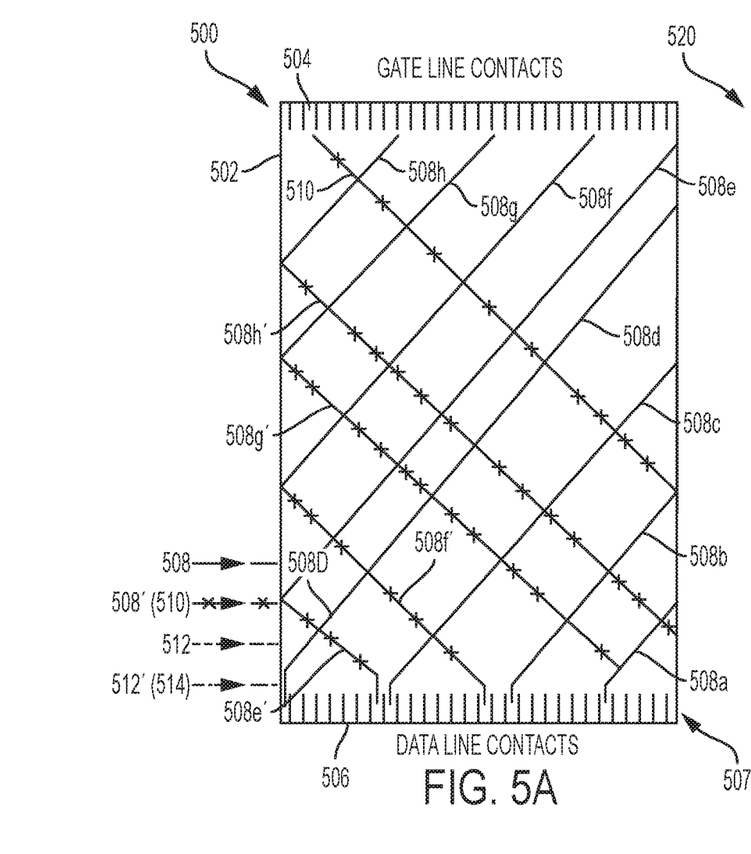
FIGS. 5A-5D illustrate an alternative embodiment of the design and construction of a TFT backplane segment addressing arrangement with both gate and data lines running diagonally across the array and continuing back when they reach the outer edge of the array.
Figure 5B:
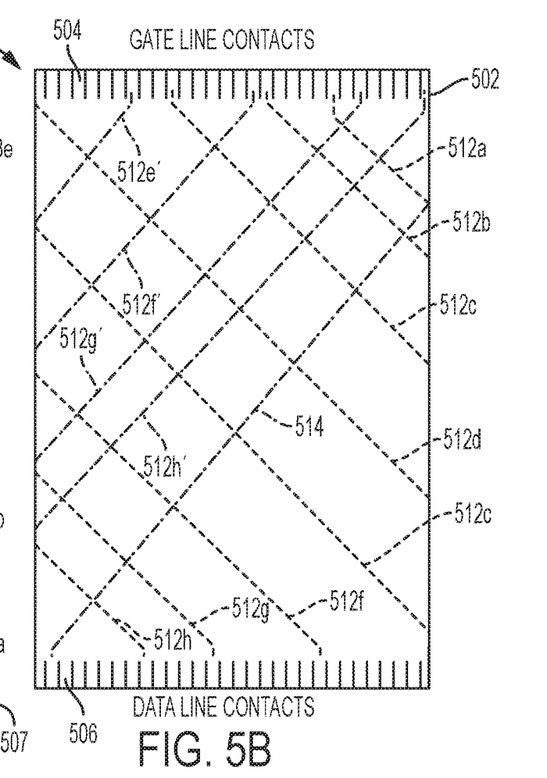
Figure 5C:
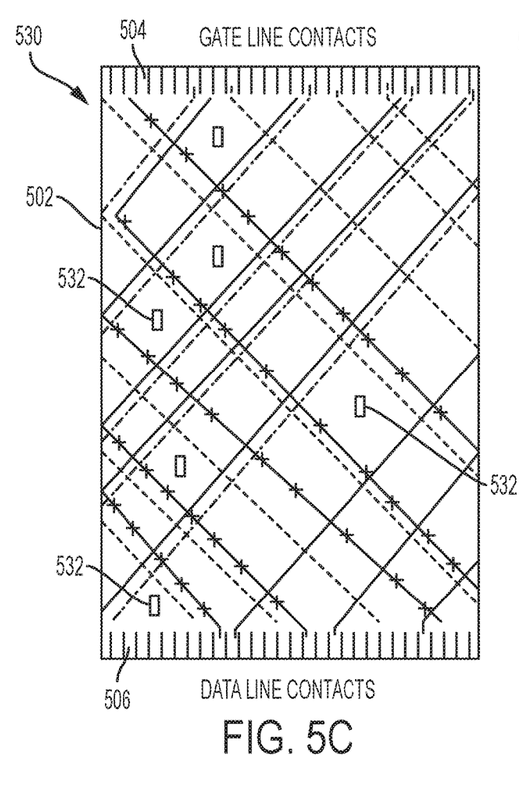
Figure 5D:
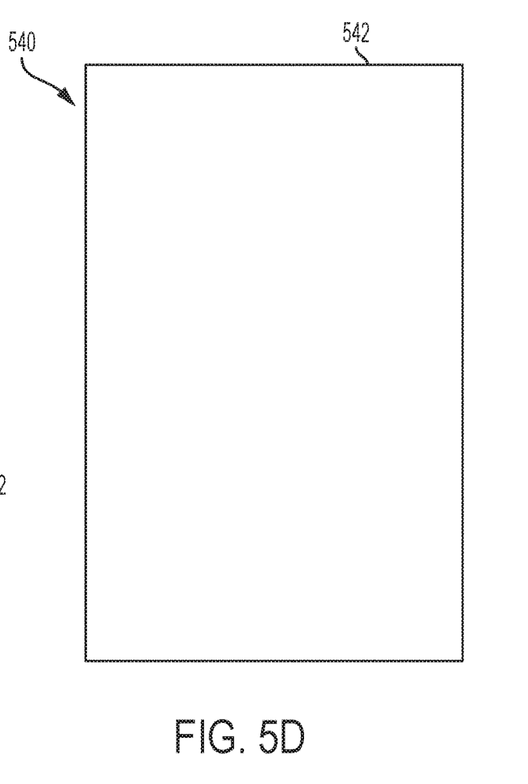

FIG. 5A depicts the layout for data lines; FIG. 5B depicts the layout for gate lines; FIG. 5C depicts a backplane with the layers combined; and FIG. 5D depicts an insulator layer for use in the present embodiment.

The configuration 500 of FIG. 5A illustrates substrate 502, gate line contacts 504, and data line contacts 506. In an embodiment, the process of generating data lines includes generating data lines 508a-508h starting from the right side bottom 507 and moving in a downward direction towards the data line contacts 506 (as opposed to starting from the top and moving towards the gate line contacts in FIG. 3B) with data lines 508a-508d in contact with the data line contacts 506. As understood from the discussion in FIG. 3B, ones of the data lines 508a-508h of FIG. 5, which would protrude past the substrate 502 (in this embodiment 508e, 508f, 508g, and 508h) are subject to a reflecting or folding action to obtain the continued data lines 508e'-508h' (the protruding is not shown in this figure). Further data line 510 is formed in a similar manner as described in FIG. 3B for gate line 328.

Turning to FIG. 5B illustrated is a description of the gate lines layout 520. Shown again for description purposes is substrate 502, gate line contacts 504, and data line contacts 506. Similar actions to those taken in FIG. 3B are undertaken in FIG. 5B to obtain gate line 512a-512h and gate lines 512e'-512h', where data lines 512a-512h are generated from the right side toward the left and data lines 512-e'-512h' are continued by reflecting or folding them from the side edges. Further, gate line 514 is formed in the same manner as described in FIG. 3B for gate line 328.

An advantage of this scheme is that all the lines run diagonally either to the left or the right, as shown in configuration 530 of FIG. 5C (which also shows exemplary TFT/photodiode arrangements 532). Also, the configurations 532 are understood to further represent other arrangements such as, but not limited to, those that may be used in construction of display backplanes.

In this and the other embodiments disclosed herein, the angle of the diagonal address lines is in the range of 40 to 50 degrees, including at times approximately 45 degrees.

Backplane configuration 530 can be easily fabricated with two metal layers, requiring only a single insulation layer, such as layer 540, of an insulating material 542 (as shown in FIG. 5D).

For example, selected data lines of FIG. 5A are manufactured in a first metal layer with the other data lines of FIG. 5A located in a second metal layer. Further, appropriate gate lines of FIG. 5B are also manufactured in the first metal layer, along with the mentioned data lines. Similarly the other gate lines of FIG. 5B are manufactured in the second metal layer, along with the previously mentioned other data lines. Therefore FIG. 5C can be interpreted to have the illustrated data lines and gate lines provided in the mentioned two metal layers.

Figure 5E:
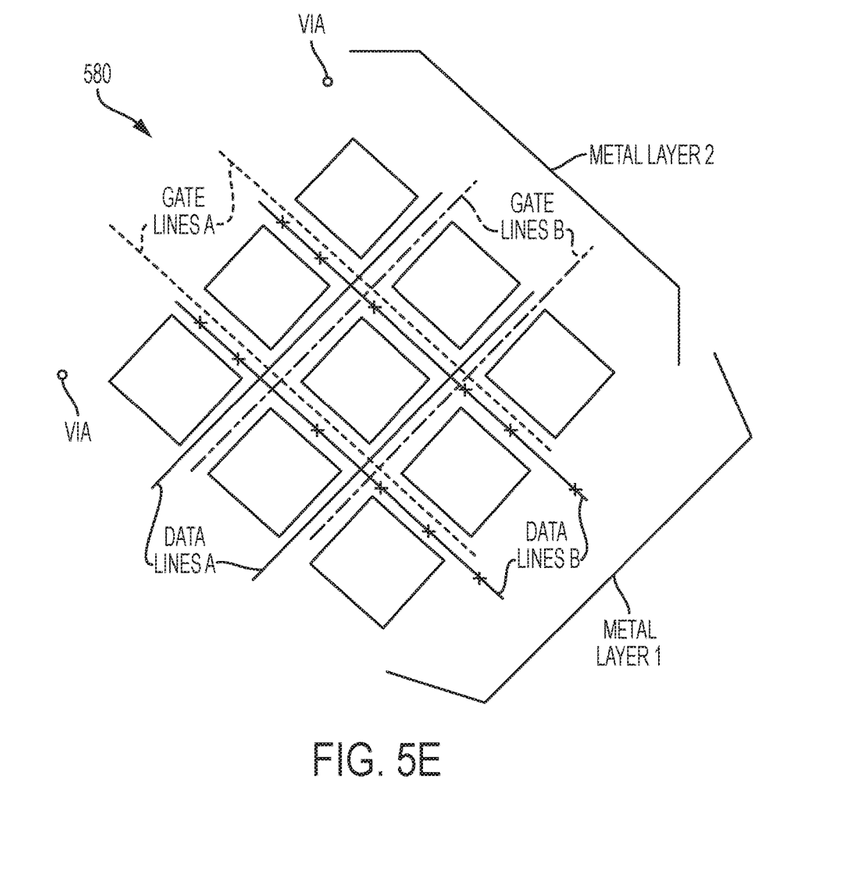
FIG. 5E illustrates a close-up view of the pixel arrangement in regions of the array where there are two gate lines and two data lines near each pixel, where the diamond shapes illustrates the location of the photodiode in each pixel.

This design is further illustrated in FIG. 5E where selected gate lines A and data lines B (e.g., from FIG. 5C) are shown running in parallel and are within a Metal Layer 1, and selected data lines A and gate lines B (e.g., from FIG. 5C) are shown running in parallel are within a Metal Layer 2. These metal layers being isolated from each other by an insulation layer as previously discussed. This design uses vias near the edge of the array, so for example if the gate lines A in FIG. 5E are in metal layer 1, then the gate lines B are in metal layer 2, so by use of the vias required interconnections are made. Similar designs may be used for the metal layer separated data lines. This design uses many fewer vias along the address lines than might be used in the embodiments of FIGS. 3C and 4C.

Each pixel is addressed by one gate and one data line. In the conventional backplane the gate line is in a first metal layer and the data line in another metal layer. In some of the pixels of this design the metals will be reversed and will require vias within the pixel. However, this is preferable to having vias along the address line because in this case the extra resistance is not a problem and only one pixel is affected if the via process fails.

The pixel shape for this design can be chosen to be a square (or rectangle) or could be diamond shaped as shown in FIG. 5E, which also shows that each pixel has both gate and data address lines running in orthogonal directions in the two metal layers. The TFT at each pixel is addressed by one or other of the gate and data lines, according to the overall matrix design.

Having twice as many address lines as some other conventional configuration does not cause degradation in the imager or other device performance. FIG. 5E indicates the location of the photodiodes in the pixel. However, the photodiodes are largely fabricated in different layers from the address lines and so can be designed to be on top of at least some of the address lines, so that the area of the pixel forming the photodiode is not significantly reduced. There are designs in which the photodiode completely covers the pixel.

Figure 6:
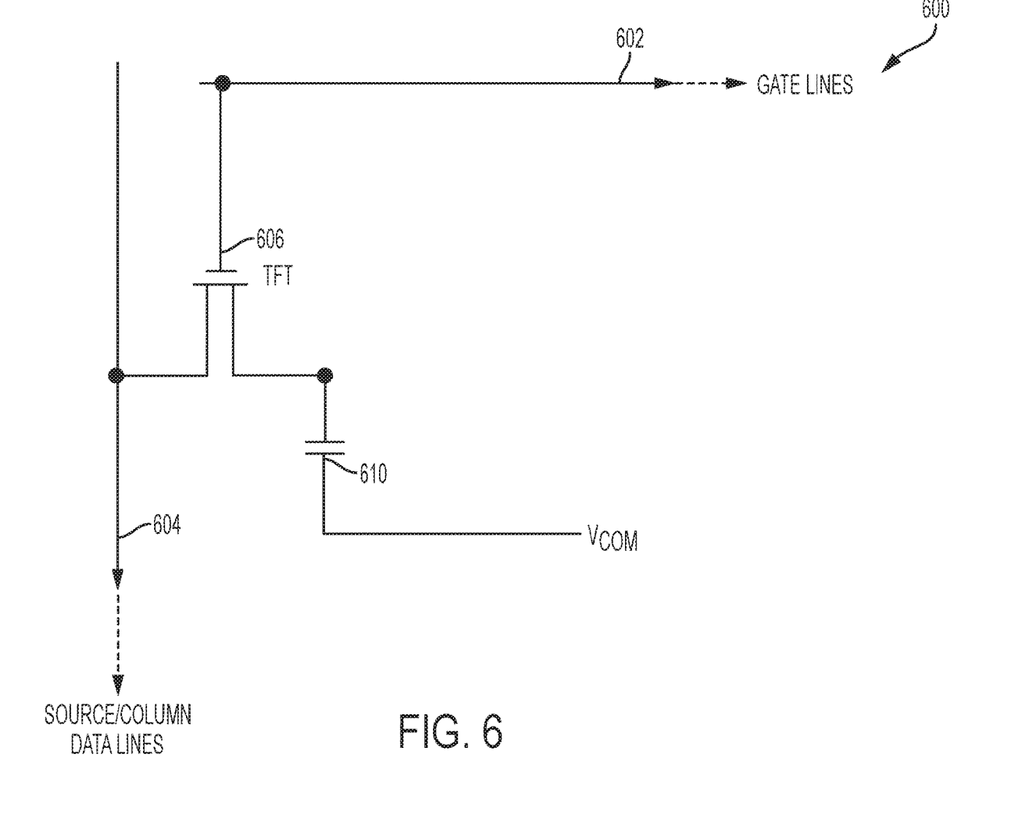
FIG. 6 illustrates are more detailed view of a pixel arrangement.

Turning to FIG. 6 illustrated is a pixel design 600 as may be used in connection with the present disclosure. As shown, a gate line 602 and data line are provided, where the gate line 602 is connected to the gate a TFT 606, and the data line 604 is connected to the source of the TFT 606. The drain of the TFT being connected to a capacitive component 610, with the other end connected to a voltage source Vcom. The capacitive component 610 may be a photodiode of other component which may be used as part of a backplane.

Because of the arrangement of gate and data lines, the readout process of selecting one gate line and reading out the data line signals, does not immediately give a raster scan of the image. Instead different areas of the array are addressed by one gate line. The image therefore needs to be reconstructed in software based on a knowledge of the addressing design and algorithms to perform this reconstruction are easily developed.

Figure 7:
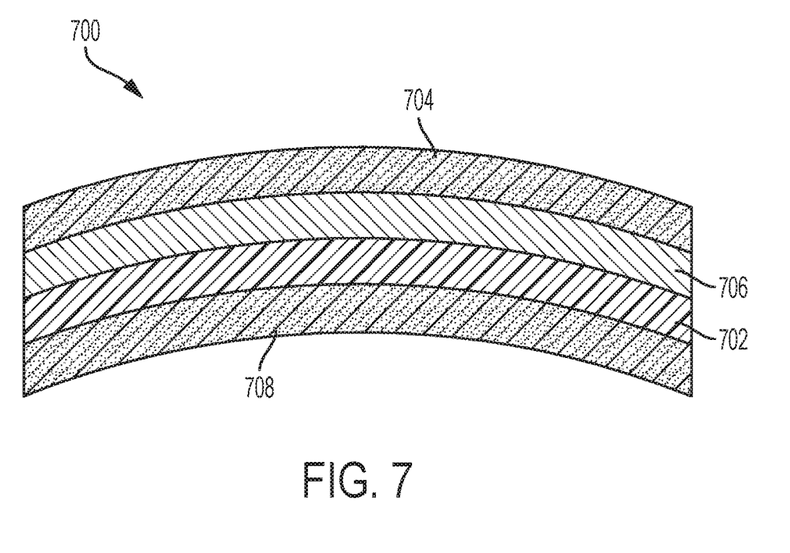
FIG. 7 illustrates an exemplary bendable detector.

The present disclosure has been described in the context of a TFT backplane for an x-ray imager. An exemplary bendable flexible detector 700 is depicted in FIG. 7. A method that may be used to form such a detector includes forming a thin polyimide (PI) layer 702 on a conventional glass substrate. After that processing is complete, a GOS scintillator 704 is bonded to the front surface to give support to the thin PI film and the a-Si layers 706. The combination is then released from a glass substrate and a plastic layer 708 is bonded to the back side for additional protection.

It has been described herein as the vertical address lines are defined as the data address lines. It is to be appreciated that in embodiments the gate lines can be made to run in the vertical direction with the data lines in the diagonal or non-vertical direction.

The same matrix addressing scheme is used for LDC, OLED, or electrophoretic displays and can apply to other pixel array devices. The addressing scheme in this disclosure may apply in the same way to these other applications and would enable flexible displays with the same ease of bending because the driver chips are on opposite sides of the array.

Disclosure has described designs and devices which are made so that the array is bendable. The configuration with addressing contacts on opposite ends of the array leaves the two other sides with no contacts. The pixels can be fabricated to the edge of the array leaving no dead space along these sides and for some applications the lack of dead space may make this addressing arrangement preferred even if the array is not bent.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A flexible TFT backplane comprising:
    a flexible substrate;
    a first set of address line contacts associated with the substrate;
    a second set of address line contacts associated with the substrate, the first set of address line contacts and the second set of address line contacts located at opposite sides of the substrate from each other, defining a vertical direction;
    a first set of address lines designed to run in one of the defined vertical direction, and a diagonal direction with respect to the defined vertical direction, the first set of address lines connected to the first set of address line contacts;
    a second set of address lines designed to run in one of a diagonal direction with respect to the defined vertical direction and a combination of diagonal and horizontal directions with respect to the vertical direction, the second set of address lines connected to the second set of address line contacts;
    at least one insulating layer located between the first set of address lines and the second set of address lines; and
    a plurality of TFTs arranged in an array within boundaries of the substrate, wherein the TFTs are addressed by the first set of address lines and the second set of address lines.

2. The flexible TFT backplane according to claim 1 further including components to form a digital x-ray detector.

3. The flexible TFT backplane according to claim 1 wherein the first set of address line contacts are data line contacts and the second set of address line contacts gate line contacts.

4. The flexible TFT backplane according to claim 3 wherein the first set of address lines are a set of data lines and the second set of address lines are a set of gate lines.

5. The flexible TFT backplane according to claim 4 wherein the set of data lines run in the diagonal direction.

6. The flexible TFT backplane according to claim 4 wherein the set of data lines run in the vertical direction.

7. The flexible TFT backplane according to claim 1 wherein the arrangement of address lines address all pixels of the TFT array.

8. The flexible backplane according to claim 1 further including components to form at least one of an LCD, an OLED and a reflective display.

9. The flexible TFT backplane according to claim 1 wherein the second address lines run diagonally from the contacts and continue back horizontally when they reach the side of the array active area, to allow all the TFT pixels to be addressed.

10. The flexible TFT backplane according to claim 1 wherein the second address lines run diagonally from the contacts and continue back diagonally when they reach the side of the array active area, to allow all the TFT pixels to be addressed.

11. The flexible TFT backplane according to claim 1 wherein the arrangement of address lines addresses all the pixels to be addressed.

12. The flexible TFT backplane according to claim 1 wherein the first set of contacts and second set of contacts are part of semiconductor devices which control the addressing of a plurality of TFTs.

13. The flexible TFT backplane according to claim 1 wherein the diagonal direction is between 40 degrees and 50 degrees.

14. A method of forming a flexible TFT backplane comprising:
    providing a flexible substrate;
    forming a first set of address line contacts associated with the substrate;
    forming a second set of address line contacts associated with the substrate, the first set of address line contacts and the second set of address line contacts located at opposite sides of the substrate from each other, defining a vertical direction;
    forming a first set of address lines designed to run in one of the defined vertical direction, and a diagonal direction with respect to the defined vertical direction, the first set of address lines connected to the first set of address line contacts;
    forming a second set of address lines designed to run in one of a diagonal direction with respect to the defined vertical direction and a combination of diagonal and horizontal directions with respect to the defined vertical direction, the second set of address lines connected to the second set of address line contacts;

forming at least one insulating layer located between the first set of address lines and the second set of address lines; and providing a plurality of TFTs arranged in an array within boundaries of the substrate, wherein the TFTs are addressed by the first set of address lines and the second set of address lines.

15. The method according to claim 14 wherein the first set of address line contacts are data line contacts and the second set of address line contacts gate line contacts.

16. The method according to claim 15 wherein the first set of address lines are a set of data lines and the second set of address lines are a set of gate lines.

17. The method according to claim 14 wherein the second address lines run diagonally from the contacts and continue back horizontally when they reach the side of the array active area, to allow all the TFT pixels to be addressed.

18. The method according to claim 14 wherein the second address lines run diagonally from the contacts and continue back diagonally when they reach the side of the array active area, to allow all the TFT pixels to be addressed.

\* \* \* \* \*